United States Patent [19]

Ellis et al.

[11] Patent Number: 5,548,338
[45] Date of Patent: Aug. 20, 1996

[54] COMPRESSION OF AN ELECTRONIC PROGRAMMING GUIDE

[75] Inventors: Michael D. Ellis, Boulder, Colo.; David B. Lazarus, Elkins Park, Pa.

[73] Assignees: News American Publishing, Inc., New York, N.Y.; Telecommunications of Colorado, Inc., Englewood, Colo.

[21] Appl. No.: 476,208

[22] Filed: Jun. 7, 1995

[51] Int. Cl.$^6$ ................................................. H04N 7/08
[52] U.S. Cl. ........................ 348/473; 348/906; 348/467
[58] Field of Search ...................... 348/906, 12, 13, 348/460, 465, 467, 468, 473, 384; 375/253; H04N 7/08

[56] References Cited

U.S. PATENT DOCUMENTS

| | | | |
|---|---|---|---|
| 4,574,382 | 3/1986 | Ko | 375/253 |
| 4,593,267 | 6/1986 | Kuroda et al. | 375/253 |
| 4,845,662 | 7/1989 | Tokumitsu | 348/465 |
| 5,168,356 | 12/1992 | Acampora et al. | 375/253 |
| 5,231,493 | 7/1993 | Apitz | 348/468 |
| 5,420,639 | 5/1995 | Perkins | 348/418 |
| 5,440,345 | 8/1995 | Shimoda | 348/467 |

*Primary Examiner*—Victor R. Kostak
*Attorney, Agent, or Firm*—Weil, Gotshal & Manges

[57] ABSTRACT

Television programming information comprising an electronic programming guide is compressed by more than fifty percent, and decompressed in environments with only moderate processing power and storage space. The coding scheme of the present invention is based on Huffman coding of characters comprising the electronic programming guide and replacement character strings occurring in the data that have high savings values. A look-up table and binary tree are constructed from the Huffman codes for use in compressing and decompressing the electronic programming guide, and a set-top box for use in the decompression operation is provided.

16 Claims, 9 Drawing Sheets

| SYMBOL | HUFFMAN CODE |
|---|---|
| A | 110 |
| B | 0101 |
| C | 0111 |
| D | 01101 |
| E | 10 |
| F | 01100 |
| G | 011101 |
| H | 01111 |
| T | 00 |
| - | 111 |
| HE- | 011100 |

COMPRESSION OF AN ELECTRONIC PROGRAMMING GUIDE

FIELD OF THE INVENTION

The present invention relates to the compression of digital data and, in particular, to a method for compressing and an apparatus for decompressing television programming information comprising an electronic programming guide.

BACKGROUND OF THE INVENTION

Until recently, television viewing has been substantially passive. A viewer is presented with a number of programs on different channels, and perhaps one channel providing television programming information. Now, viewers increasingly demand more robust systems for providing them with real-time programming information. Such information, for example, may be provided in the form of an electronic programming guide ("EPG"), such as TV Guide On-Screen.

Typically, a central provider, such as a cable television company, codes program broadcast data and EPG data on a signal, which is distributed to a large viewer audience. The signal is received and decoded by individual viewers through the use of set-top boxes. Optionally, a viewer may be able to communicate data back to the service provider or to other viewers.

Compressing EPG data is desirable for a number of reasons. A major goal of EPG design is to store as much programming information as possible and, by compressing existing data, significantly more data may be provided to viewers in an equivalent data space. This factor is particularly important in regard to designing an efficient set-top box, as a marginal increase in the cost of such a design may have a significant impact. Also, compressing EPG data improves a transmission channel's bandwidth. Increased bandwidth is pertinent with regard to the transmission of data both upstream and downstream to an individual viewer, and significant compression ratios may enable applications previously unknown.

The suitability of a particular compression technique depends on the constraints presented by a specific application. In the context of compressing and decompressing data comprising an EPG, four constraints are pertinent.

First, EPG data comprises short messages, which are typically 10 to 250 characters and rarely more than 1000 characters in length. Most compression techniques assume that text strings will be very long, and are directed to operations on larger data objects, such as entire computer files. The set of data comprising an EPG illustratively comprises approximately 88 kilobytes of uncompressed text divided into 1000 short messages, each of which must be adaptable to independent compression and recovery. Existing compression techniques do not provide an ideal solution.

Second, a viewer's set-top box has limited storage. One of the motivations for compressing EPG data is to save memory space, so any resource costs must be subtracted from resource savings. Most compression techniques assume that significant storage space is available for running a program to decode data and to store associated data structures. In the context of an EPG, decompression must be performed in very limited code and data space.

Third, to avoid the need to update data used in decompression, the decompression operation should not rely on the use of repeated words or phrases. EPG data contains large proportions of unique or rare proper nouns. Also, popular words or phrases are cyclical (e.g., "basketball" is popular in the spring while "football" is popular in the fall) and change over time (e.g., names, current events, popular shows, etc. change over time). Because word selection in an EPG is broad and transient, a dictionary keyed to individual words or phrases is inefficient and should be avoided.

Fourth, a viewer's set-top box has limited processing resources, as a set-top box should be inexpensive for widespread distribution. Even without a decompression feature, performance of a set-top box is a major concern. The decompression operation should be performed without heavy processing, and a technique using extensive searching is not acceptable.

Although a number of compression techniques are in use today for digital data, existing compression techniques, standing alone, do not adequately address the four constraints presented in the EPG context. Run-length coding, which takes advantage of long strings of repeated characters, is not useful for EPG data that generally includes few repeated characters. LZ coding, in which repeated strings of characters reference earlier occurring strings of characters, requires too much processing power and memory, and only provides about 40% compression for EPG data. Huffman coding, although requiring little processing power and memory, only provides about 40% compression for EPG data. Character substitution coding, in which frequently occurring pairs of characters are replaced with unused character codes, is similar in demands and results to Huffman coding.

SUMMARY OF THE INVENTION

The present invention solves the problem of compressing EPG data. With the method and apparatus of the present invention, a diverse text of EPG data may be compressed by more than 50%, yet be decompressed in environments with only moderate processing power and storage space.

The coding scheme of the present invention is prepared in the following way. Typical EPG data is assembled. Huffman coding information is then prepared based on the frequency of occurrence of each character in the EPG data. The EPG data is scanned to find candidate character strings that occur more than some threshold number of times, and a savings value is associated with each candidate character string. From the candidate character strings, particular character strings are selected to serve as replacement character strings. Finally, Huffman codes are constructed for the replacement character strings and the individual characters.

A look-up table and binary tree are constructed from the Huffman codes for use in compressing and decompressing EPG data. Compressed text is created by serially scanning EPG data and building the text from Huffman codes obtained from a look-up table. If a replacement character string is found, the Huffman code associated with the replacement character string is used; if a replacement character string is not found, the Huffman code associated with the individual characters are used. Decompressed text is created by serially scanning the compressed text and parsing it with a binary tree. When a terminal branch is reached, the character or character string that it represents is added to the decompressed text.

DESCRIPTION OF THE FIGURES

The foregoing advantages of the present invention are apparent from the following detailed description of the preferred embodiment of the invention with reference to the drawings, in which.

DETAILED DESCRIPTION OF THE PREFERRED EMBODIMENT

Figure 1A:
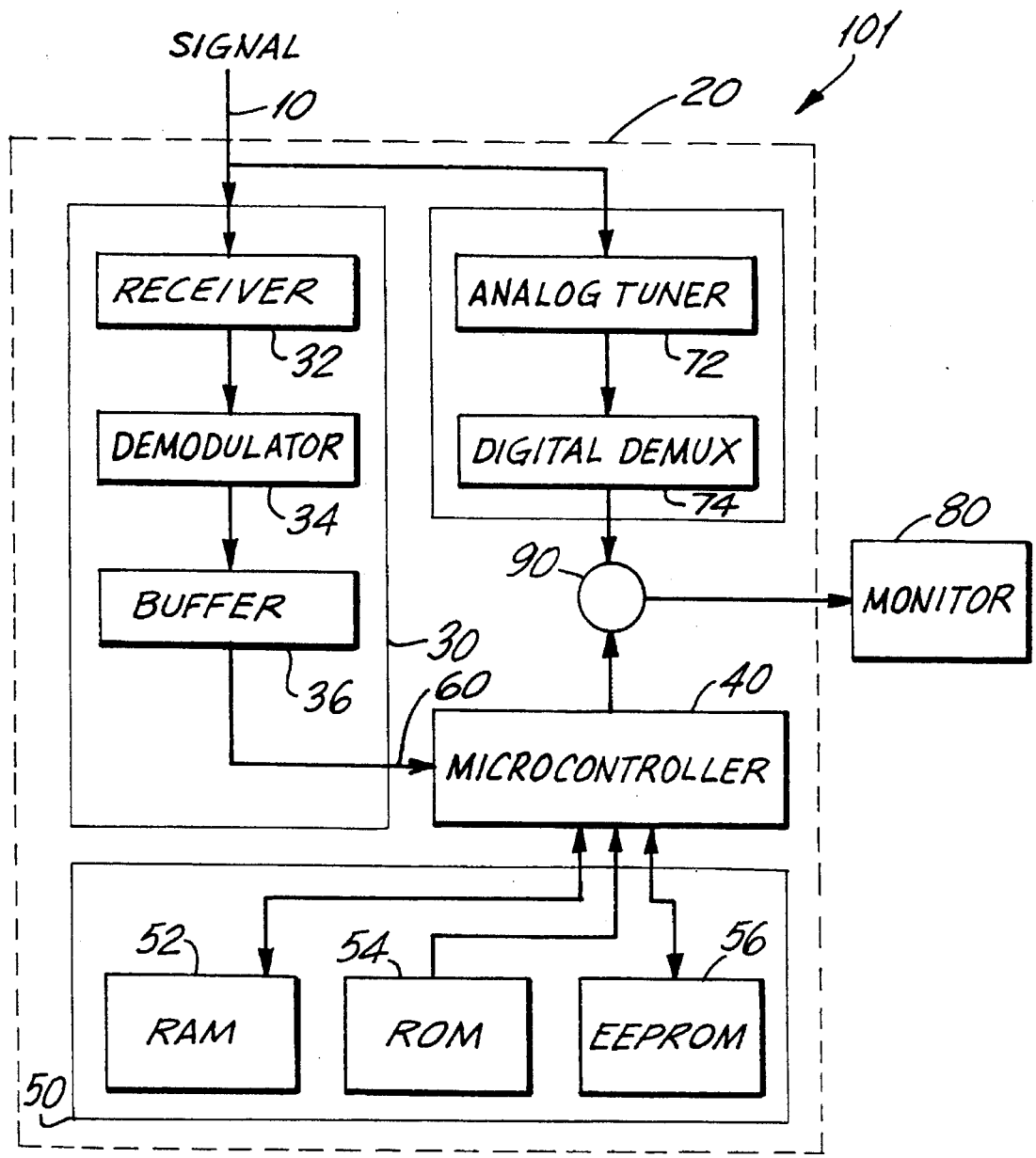
FIG. 1A shows a block diagram of a first system to which the present invention applies.

FIG. 1A shows a block diagram of the configuration of a first system 101 to which the present invention applies. A service provider, such as a cable-television provider, distributes a signal 10 to a plurality of subscribers, each having set-top box 20. Signal 10 may be distributed and received through a variety of means, including electrical, optical, microwave, or other forms of transmission. At a minimum, signal 10 comprises EPG data compressed according to the present invention. Signal 10 may also include program broadcast signals, software updates, or other information.

Set-top box 20 includes components for receiving and processing signal 10. These components include reception module 30, microcontroller 40, and storage module 50. Reception module 30, for example, may comprise a receiver 32, demodulator 34, and buffer 36 for receiving signal 10 and providing compressed EPG data stream 60 to microcontroller 40. Compressed EPG data stream 60 comprises a digital representation of the compressed EPG data and may be provided to microcontroller 40 in serial or parallel form; it may optionally be scrambled or include parity information, header information, or other information. Microcontroller 40 receives and stores compressed EPG data stream 60 in storage module 50. When the compressed data is needed by the application for display to monitor 80, the compressed data is retrieved from storage module 50 and decompressed. Storage module 50 may comprise RAM 52, ROM 54, and EEPROM 56 for respectively storing decompressed EPG data, a Huffman tree for use in decompression, and application software for performing decompression. However, storage module 50 may comprise other combinations or uses of volatile and non-volatile storage devices, including battery backed-up static RAM, flash memory, or magnetic or optical disk.

Compressed EPG data stream 60 may be stored in a variety of ways. In the preferred embodiment, character strings comprising data items (such as long titles or descriptions) are stored in individual records marked by byte boundaries. The length of each record is stored at a fixed location within each record, and represents the number of bytes needed to hold the compressed string. In this scheme, an end-of-string character is not necessary. The end of a compressed string is determined by the length of the compressed string. If a string does not end on a byte boundary, the remaining bits in the last byte are filled with a code that may not be translated into a legal character. This embodiment has two advantages. First, the size of variable-length records may be determined without decompression. Second, data items may be decompressed independently.

Set-top box 20 may optionally include tuner module 70 for decoding television broadcast signals, or other signals, and providing these signals to monitor 80. Tuner module 70 may comprise an analog tuner 72, a digital demultiplexer 74, or both devices (if signal 10 comprises both analog and digital data, or a digital signal modulated on an analog carrier). FIG. 1 shows an illustrative embodiment in which both an analog tuner 72 and a digital demultiplexer 74 are used; however, signal 10 may consist of data that may be provided directly to digital demultiplexer 74, or data that does not require digital demultiplexer 74.

Microcontroller 40 may also provide modulated program guide data or other data for display on monitor 80. Switch 90 may be used to select between sources. If a television signal is provided to monitor 80, a modulator for modulating the digital signals used in microcontroller 40 and digital demultiplexer 74 may be included in these devices, or optionally integrated into switch 90.

Figure 1B:
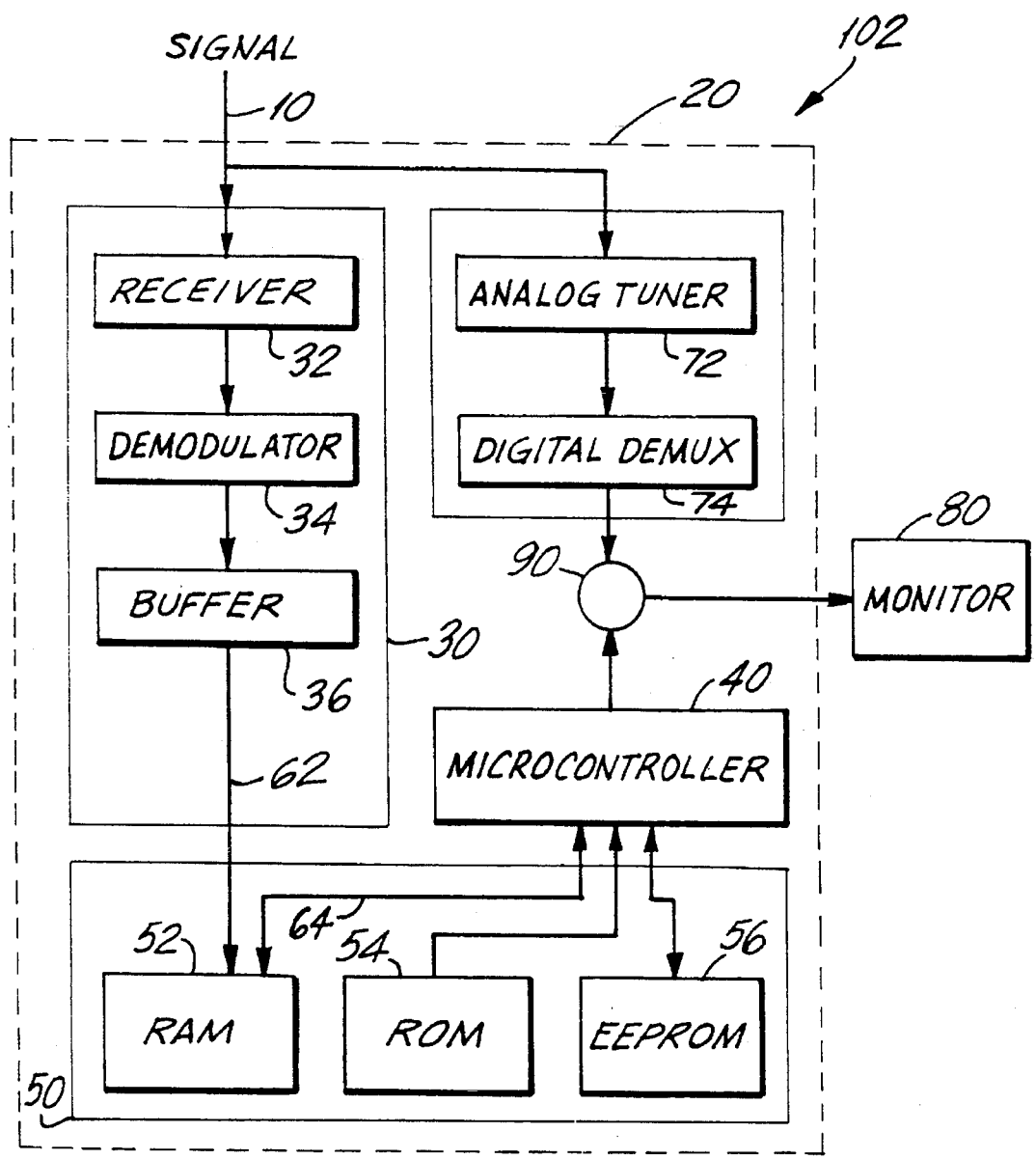
FIG. 1B shows a block diagram of a second system to which the present invention applies.

FIG. 1B shows a block diagram of the configuration of a second system 102 to which the present invention applies. The second system 102 is similar to the first system 101, other than in the provision of compressed EPG data to microcontroller 40. In the second system 102, instead of providing compressed EPG data directly to microcontroller 40, compressed EPG data stream 62 is stored directly in storage module 50 and then accessed by microcontroller 40 via path 64, which is preferably a parallel data bus. In all respects, compressed EPG data stream 62 may comprise the same data as compressed EPG data stream 60. An illustrative but not exclusive way to implement this scheme is where RAM 52 is provided on a bus that allows independent access by both buffer 36 and microcontroller 40.

In each of the first and second illustrative embodiments 101 and 102, set-top box 20 and monitor 80 may be integrated into a single system, or be components in a larger system, such as a personal computer. Also, depending on the form of signal 10, the components of set-top box 20, in whole or in part, may be integrated into a single integrated circuit chip.

The various features, capabilities, and advantages of systems 101 and 102 to which the present invention applies are further and alternatively described in applicant's co-pending application, Ser. No. 08/119,367, which is incorporated here by reference. Also, the present invention may be used with numerous commercial set-top boxes, including General Instruments' DCT 1000 product.

Figure 2:
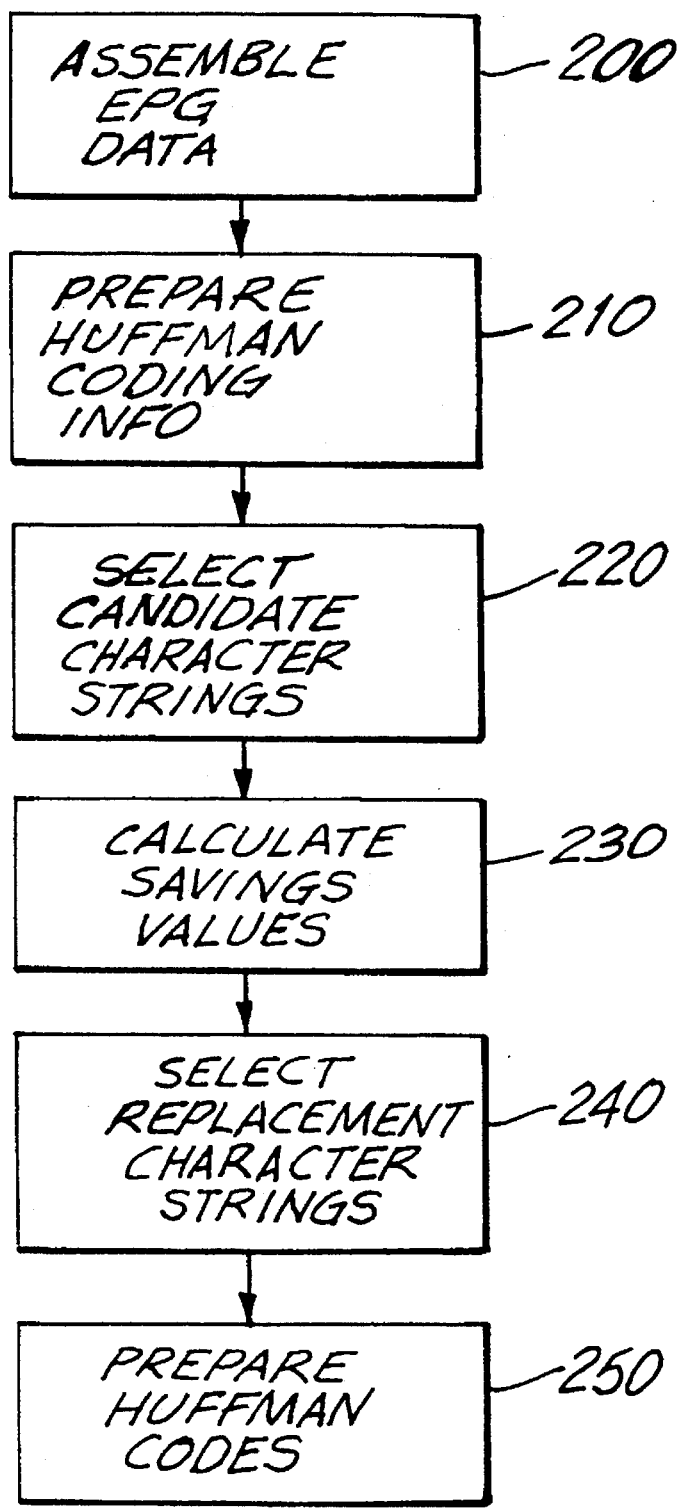
FIG. 2 shows a flowchart for preparing the coding scheme of the present invention.

FIG. 2 shows a flowchart for preparing the coding scheme of the present invention. The coding scheme of the present invention may be prepared in a number of ways, such as by hand calculation or through the use of computer application software.

The first step in preparing the coding scheme is to assemble typical EPG data in step 200. This data should resemble typical EPG data that will be provided on an on-going basis to end users of the system. Also, the EPG data must include each unique character that will ever arise in EPG text. Because the coding scheme may be based on probabilities, one may optionally use a plurality of sets of EPG data for coding.

In step 210, Huffman coding information is assembled for each character in the EPG data. A character is any character, mark, or symbol that may exist independently of other characters, marks and symbols. For example, characters may include letters of the alphabet (in uppercase and lowercase), arabic numerals, punctuation, imbedded control codes (such as marks for carriage return or bold print), and other marks and symbols (such as marks for close-captioned or stereo broadcast, or network marks, such as "MTV" or "HBO"). Characters may be different sizes, and a character's frequency of occurrence is the number of times that it appears in the data.

Figure 3:
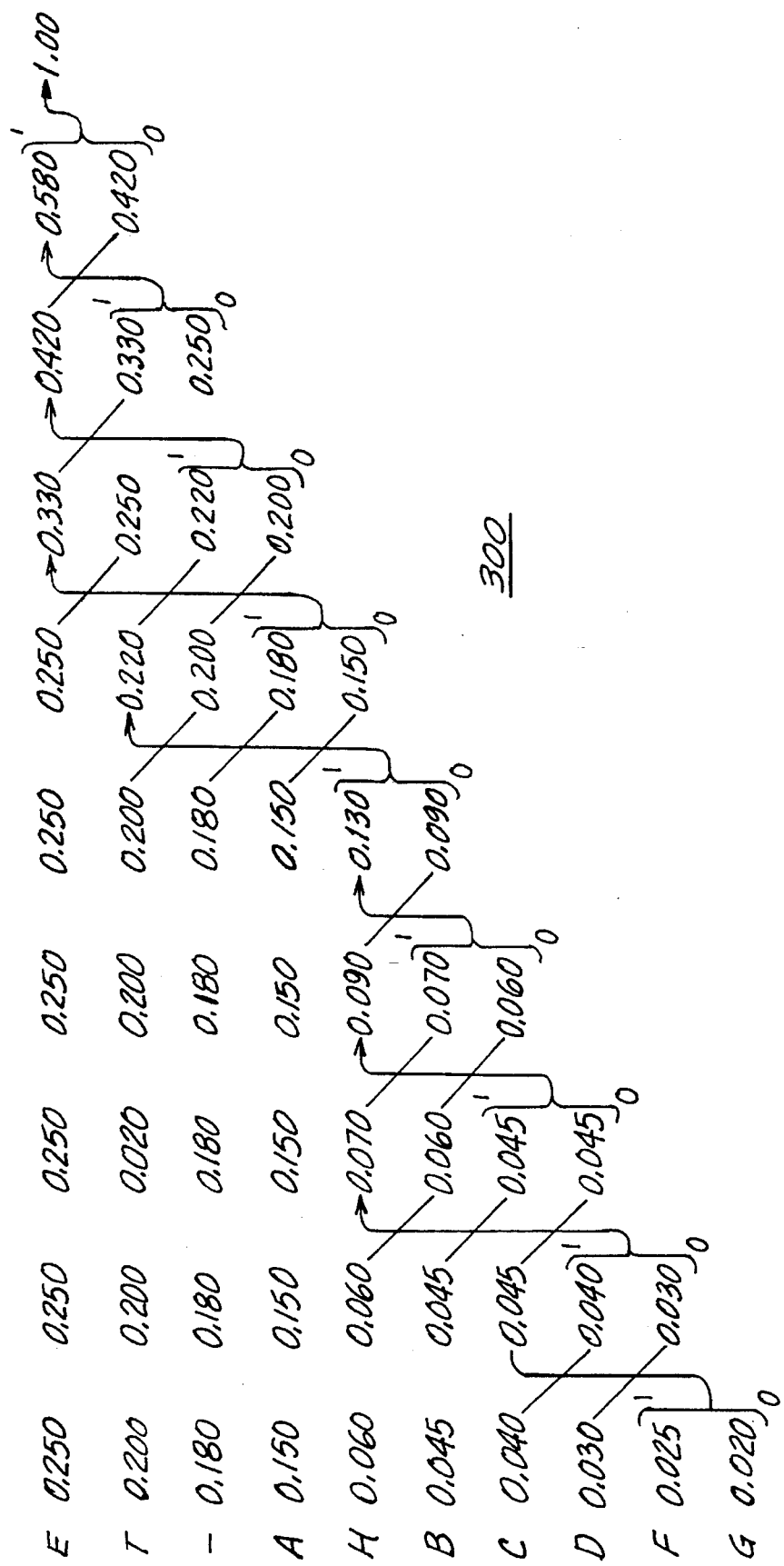
FIG. 3 shows a chart for obtaining Huffman codes for an illustrative set of data prior to character string compression.
Figure 4:
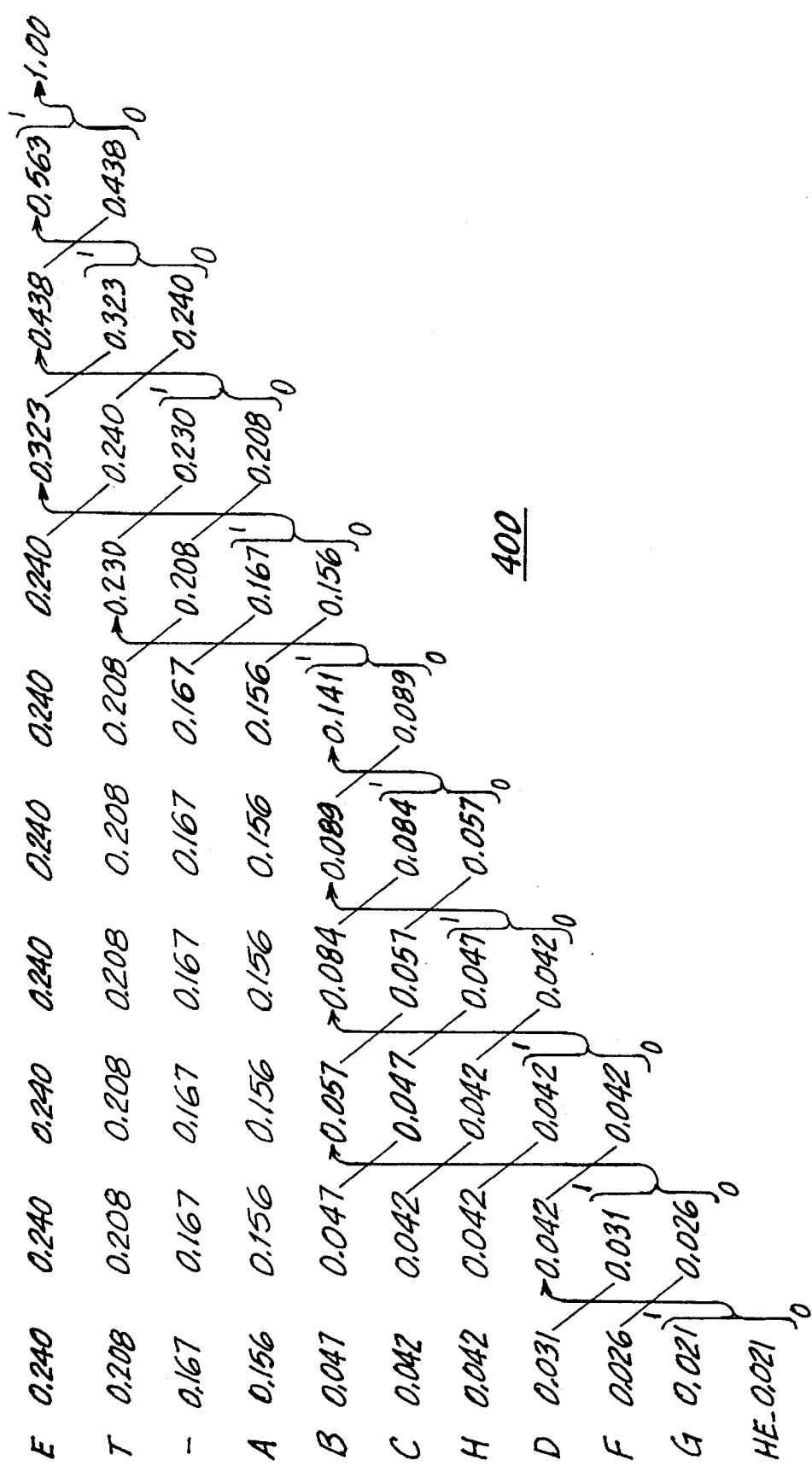
FIG. 4 shows a chart for obtaining Huffman codes for an illustrative set of data following character string compression.

Huffman coding information consists of the number of bits required to represent each character in Huffman code. Huffman codes for each character may be obtained through a number of known techniques. One way is to create a lowest-probability pair chart. In this chart, characters are listed in descending order of probability. The two lowest probabilities are grouped to form a lowest-probability pair; this lowest-probability pair and the remaining probabilities are transferred to a new column in descending order of probability; and the process is repeated until the final probability—a probability of 1.0—is reached. FIGS. 3 and 4 show examples of lowest-probability pair charts.

Such charts are read as follows. Each of the lowest-probability pairs forms a node. One element of the pair is assigned "1" and the other element "0". A coding for each character is obtained by tracing it from left to right across the chart, collecting the code digits at each lowest-probability pair junction. Reversing the order of the code digits provides a Huffman code for each character. For any set of probabilities, a plurality of Huffman codes are possible for any character.

Table 1 was created using step 210 for illustrative EPG data consisting of 20,000 characters from a set of ten characters: A, B, C, D, E, F, G, H, T, and a blank character. Although this data differs from EPG data used in actual applications (which illustratively consists of at least 88 kilobytes of data from a set of about 200 unique characters), the illustrative EPG data explains the invention. The table lists the characters, their frequency of occurrence, their probability of occurrence, their Huffman code, the number of bits comprising their Huffman code, and the total size in bits of the compressed text representing each character. The Huffman codes shown in Table 1 are derived from chart 300 shown in FIG. 3.

Returning to FIG. 2, the EPG data is scanned to find candidate character strings in step 220. Character strings are any contiguous grouping of two or more characters, and a candidate character string is any character string that is found in the EPG data more than some threshold number of times. While the threshold may theoretically be set as low as one, it is not practical to do so—for example, the first and last 19,999 characters of a 20,000 character data set and groupings between the two ends would satisfy the candidate restriction.

Typically, a suitable threshold frequency for a candidate character string is the median frequency of all characters, divided by the length of the candidate character string. The median frequency is a frequency such that about half of all characters occur more often, and about half occur less often. In the data shown in Table 1, the median frequency is between 900 and 1200, as five characters have a frequency of 900 or less, and five characters have a frequency of 1200 or more. Picking the low end of this range, 900, to maximize the number of candidate character strings, the threshold for strings of two characters is 450; the threshold for strings of three characters is 300; the threshold for strings of four characters is 225; etc.

Also, by checking for candidate character strings of length two and then proceeding to strings of ordinally-larger length (i.e., three, four, etc.), a maximum candidate character string length may be ascertained by finding a length for which no candidate character strings meet the threshold. At this point, all potential candidate character strings have been found and step 220 is complete.

In step 230, a savings value is associated with each candidate character string based on its frequency of occurrence versus the frequency of occurrence of its component characters. An illustrative but not exclusive way to determine savings values is through the equation:

$$SV(S) = f_S * (\Sigma C_S - eC_S),$$

where S is a candidate character string, $f_S$ is the frequency of occurrence of S in the EPG data, $eC_S$ is the estimated number of bits comprising a Huffman code to represent S, and $\Sigma C_S$ is the sum of the number of bits in the Huffman codes calculated in step 210 for each character comprising S. The estimated number of bits comprising a Huffman code to represent S may be established by comparing the frequency of occurrence of S with the frequency information prepared in step 210 for each character. For example, if S has a frequency of occurrence of 500, one may look for characters that have equivalent, or similar, frequencies of occurrence in the EPG data.

To illustrate step 230, Table 2 shows savings values calculated for three character strings that hypothetically arise in the illustrative EPG data considered in Table 1. Here,

TABLE 1

| CHARACTER | FREQUENCY | PROBABILITY | HUFFMAN CODE | HUFFMAN BITS | SIZE (BITS) |
|---|---|---|---|---|---|
| A | 3,000 | 0.150 | 110 | 3 | 9,000 |
| B | 900 | 0.045 | 0101 | 4 | 3,600 |
| C | 800 | 0.040 | 01111 | 5 | 4,000 |
| D | 600 | 0.030 | 01110 | 5 | 3,000 |
| E | 5,000 | 0.250 | 10 | 2 | 10,000 |
| F | 500 | 0.025 | 01001 | 5 | 2,500 |
| G | 400 | 0.020 | 01000 | 5 | 2,000 |
| H | 1,200 | 0.060 | 0110 | 4 | 4,800 |
| T | 4,000 | 0.200 | 00 | 2 | 8,000 |
| — | 3,600 | 0.180 | 111 | 3 | 10,800 |
| Total | 20,000 | 1.00 | | | 57,700 | the estimated number of bits comprising each string's Huffman code is established by comparing each string's frequency of occurrence with the frequency and Huffman code information shown in Table 1 for the individual characters.

the replacement character string "HE_" from Table 2 is also incorporated into the coding scheme. The Huffman codes shown in Table 3 are derived from chart 400 shown in FIG. 4.

TABLE 2

| S | $F_S$ | $eC_S$ | $\Sigma C_S$ | SV(S) |
|---|---|---|---|---|
| E_ | 700 | 5 | 5 | 0 |
|  | $(f_d=600) < f_{E\_} < (f_c=800)$ | $(C_d=5) \geq eC_{E\_} \geq (C_c=5)$ | (2+3) |  |
| HE_ | 400 | 5 | 9 | 1600 |
|  | $(f_g=400) = f_{HE\_}$ | $C_g = eC_{HE\_}$ | (4+2+3) |  |
| THE_ | 300 | 6 | 11 | 1500 |
|  | $0 < f_{THE\_} < (f_g=400)$ | $\infty \geq eC_{THE\_} \geq (C_g=5)$ | (2+4+2+3) |  |

In step 240, particular character strings are selected from the candidate character strings to serve as replacement character strings. An illustrative but not exclusive way to select replacement character strings is to select candidate character strings with the highest savings values. However, care must be exercised in selecting replacement character strings. For example, it may be inefficient to select replacement character strings that are components of other character strings, such as selecting both "HE_" and "THE_" from the data given in Table 2. In these cases, the estimated savings value will be reduced by approximately the savings of the shorter string multiplied by the frequency of the longer string, divided by the frequency of the shorter string. For example, the approximate savings of selecting both "HE_" and "THE_" as replacement character strings would equal 1600+1500−1600*300/400, or about 1900. This value is not substantially better than the estimated savings of 1600 for just selecting "HE_" as a replacement character string.

Also, it may be inefficient to select an excess number of replacement character strings. Although the optimal number to select will vary with the composition of EPG data, substantial compression has been obtained by selecting between 10 and 50 replacement character strings for representative EPG data. Replacement character strings should not be selected that have negative or near-zero savings values.

In step 250, Huffman codes are constructed for the replacement character strings and the individual characters. The Huffman codes may be constructed in a manner similar to that used to obtain the Huffman coding information in step 210, except that frequency information and probability information are preferably adjusted to reflect the use of replacement character strings. Table 3 shows the Huffman codes for the illustrative set of data given in Table 1 where

TABLE 3

| CHARACTER (STRING) | FREQUENCY | PROBABILITY | HUFFMAN CODE | HUFFMAN BITS | SIZE (BITS) |
|---|---|---|---|---|---|
| A | 3,000 | 0.156 | 110 | 3 | 9,000 |
| B | 900 | 0.047 | 0101 | 4 | 3,600 |
| C | 800 | 0.042 | 0100 | 4 | 3,200 |
| D | 600 | 0.031 | 01101 | 5 | 3,000 |
| E | 4,600 | 0.240 | 10 | 2 | 9,200 |
| F | 500 | 0.026 | 01100 | 5 | 2,500 |
| G | 400 | 0.021 | 011101 | 6 | 2,400 |
| H | 800 | 0.042 | 01111 | 5 | 4,000 |
| T | 4,000 | 0.208 | 00 | 2 | 8,000 |
| _ | 3,200 | 0.167 | 111 | 3 | 9,600 |
| HE_ | 400 | 0.021 | 011100 | 6 | 2,400 |
| Total | 19,200 | 1.00 |  |  | 56,900 |

From this table, it is apparent that 800 bits are saved by using replacement character string "HE_" in compressing the illustrative set of data considered in Table 1. The estimated savings value for "HE_" computed in step 230 and shown in Table 2 was 1600 bits. Although the estimated and actual savings values may differ in the illustrated embodiment, the estimated savings value provides a good approximation of the relative savings values for multiple candidate character strings.

Figure 5:
FIG. 5 shows a Huffman table prepared according to the present invention for an illustrative set of data.
Figure 6:
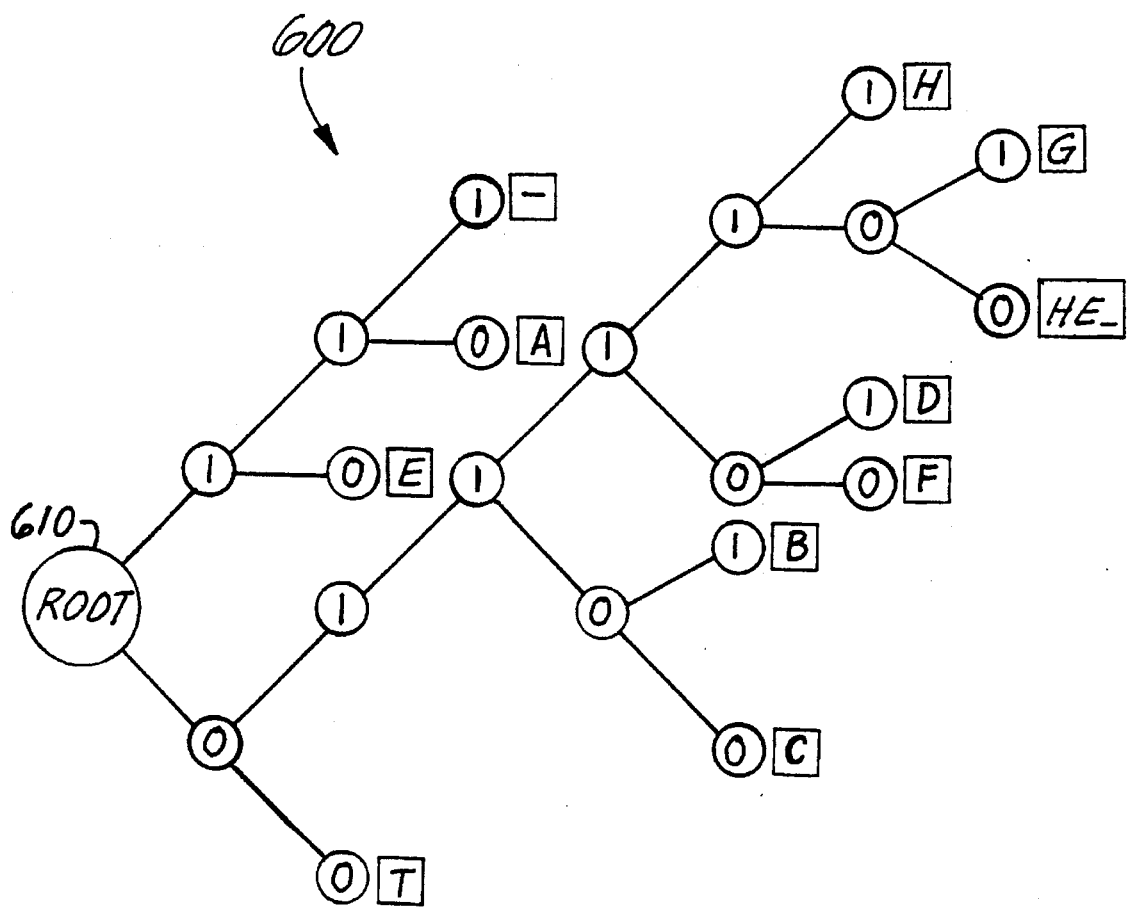
FIG. 6 shows a Huffman tree prepared according to the present invention for an illustrative set of data.

A look-up table and binary tree may be constructed from the Huffman codes prepared in step 250 for use in compressing and decompressing EPG data. FIG. 5 shows a Huffman table 500 for the illustrative set of data shown in Table 3, and FIG. 6 shows a Huffman tree 600 for this illustrative set of data. A variety of known techniques and data structures may be used for storing such data, including arrays, linked lists, pointers, and other techniques. Huffman table 500 is maintained by the service provider and is used to compress EPG data. The table is preferably stored in non-volatile storage, such as a disk drive, of a computer system for use in preparing compressed EPG data. Huffman tree 600 is maintained by a subscriber and is used to decompress EPG data. Huffman tree 600 is preferably stored in non-volatile storage of set-top box 20, such as in ROM 54.

Figure 7:
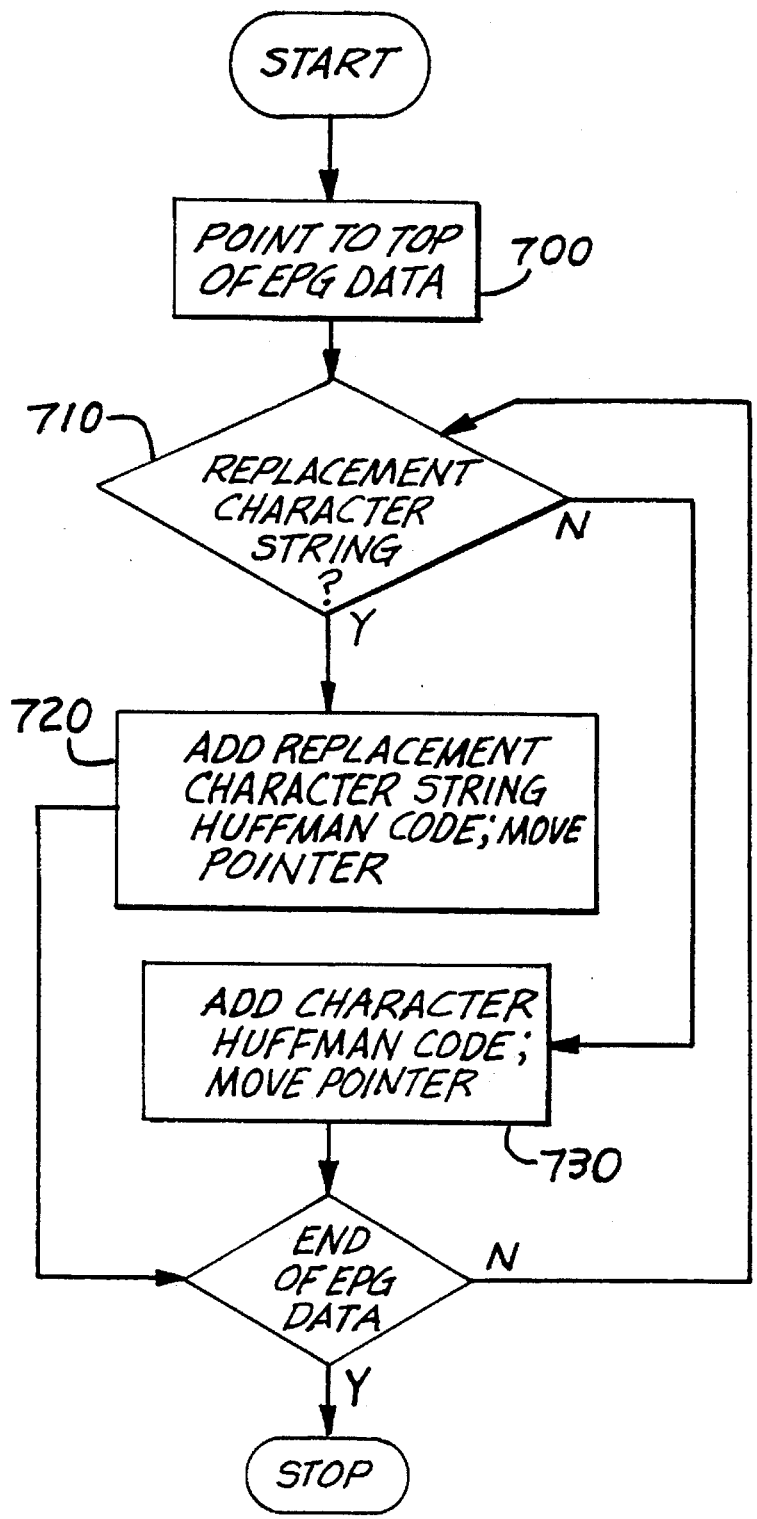
FIG. 7 shows a flowchart for compressing data according to the present invention.

FIG. 7 shows a flowchart for preparing compressed EPG data according to the present invention. Step 700 sets a pointer to the top of the EPG data. Step 710 determines if the character pointed to is the first character in a replacement character string. If so, the Huffman code associated with the replacement character string is added to the end of the compressed text and the pointer is moved to the character following the replacement character string in step 720. If a replacement character string is not found, the Huffman code associated with the individual character pointed to is added to the end of the compressed text and the pointer is moved to the next character in step 730. If the pointer does not point to the end of the EPG data, control loops back to step 710.

A computer application program for performing the steps shown in FIG. 7, or similar compression steps, may be prepared in a variety of ways and through the use of numerous programming techniques, such as through coding in Visual Basic or the C programming language. Such a program is preferably stored in non-volatile storage, such as a disk drive, of a computer system for use in preparing compressed EPG data.

Figure 8:
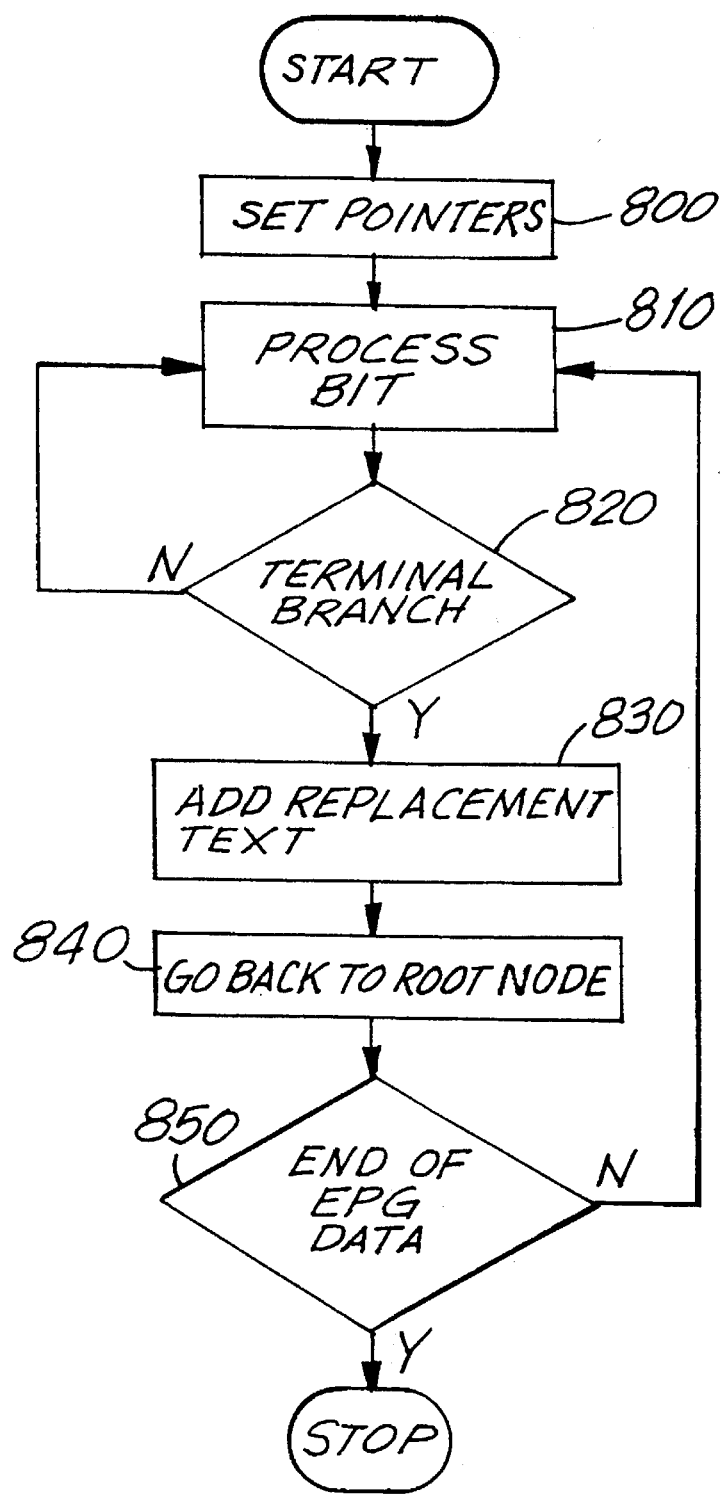
FIG. 8 shows a flowchart for decompressing data according to the present invention.

FIG. 8 shows a flowchart for obtaining EPG data from compressed EPG data. In step 800, a first pointer is set to point to the first binary digit in the compressed EPG data, and a second pointer is set to root node 610 of Huffman tree 600. Step 810 processes the binary digit at the first pointer by moving down the corresponding path of the Huffman tree and updating the two pointers. Step 820 tests the branch of the Huffman tree at the second pointer. If it is a terminal branch, the character or character string that it represents is added to the decompressed text in step 830, the second pointer is set to root node 610 of Huffman tree 600 in step 840, and control loops back to step 810 if step 850 determines that the first pointer does not point to the end of the compressed EPG data. If the branch of the Huffman tree tested in step 820 is not a terminal branch, control loops back to step 810.

A computer application program for performing the steps shown in FIG. 8, or similar decompression steps, may be prepared in a variety of ways and through the use of numerous programming techniques, such as through assembly-language coding for microcontroller 40. Such a program is preferably stored in non-volatile storage of set-top box 20, such as in EEPROM 54.

To illustrate the processes of compression and decompression, EPG data comprising the string "THE_CAT" may be coded into compressed EPG data comprising the binary code "00011100010011000" by reference to FIGS. 5 and 7. This binary code may be returned to EPG data comprising the original string "THE_CAT" by reference to FIGS. 6 and 8.

Using the method and apparatus of the present invention, substantial compression of EPG data may be achieved. The illustrative data shown in Tables 1 and 3, for example, may be represented in uncompressed text in 80,000 bits through 4-bit coding per character. The technique shown in Table 1 of Huffman-coding characters achieves 28% compression, while the technique shown in Table 3 of Huffman-coding characters and one replacement character string achieves 29% compression.

Table 4 shows the composition of illustrative EPG data. Such data comprises approximately 88 kilobytes of uncompressed text using 8-bit coding per character.

TABLE 4

| DATA ITEM | NUM-BER | AVERAGE SIZE (BYTES) | SIZE (BYTES) |
|---|---|---|---|
| Long titles | 444 | 25 | 11,100 |
| Descriptions | 243 | 120 | 29,160 |
| Promotions | 49 | 200 | 9,800 |
| Package Descriptions | 14 | 267 | 3,738 |
| Subscription | 10 | 220 | 2,200 |

TABLE 4-continued

| DATA ITEM | NUM-BER | AVERAGE SIZE (BYTES) | SIZE (BYTES) |
|---|---|---|---|
| Help | 130 | 200 | 26,000 |
| Message | 20 | 233 | 4,660 |
| Price Reason | 20 | 50 | 1,000 |
| PPV Channel Info | 10 | 20 | 200 |
| Local Info | 1 | 135 | 135 |
| Total | | | 87,993 |

For typical EPG data, Huffman-coding characters alone achieves approximately 40% compression. Using the technique of the present invention in which all unique characters and typically between 10 and 50 replacement character strings are Huffman coded, compression of up to 50% may be obtained, yet decompression may occur in set-top box 20 with only moderate processing power and storage space.

Although the invention has been shown and described in terms of a preferred embodiment, those persons skilled in the art will recognize that modifications to the preferred embodiment may be made. Various data structures and components may be used; techniques equivalent to Huffman coding (including, without limitation, Fano coding) may be employed; and data structurally equivalent to EPG data may be used without departing from the spirit of the invention as claimed below.

The claimed invention is:

1. A method for compressing an electronic programming guide, comprising:

assembling data representative of said electronic programming guide and comprising a plurality of characters;

determining a number of bits required to represent each of said characters in Huffman code;

selecting a plurality of candidate character strings from said data, said candidate character strings occurring more than a threshold number of times in said data and comprising at least two said characters;

calculating a savings value for each of said candidate character strings using at least said number of bits required to represent in Huffman code each of said characters comprising said candidate character string;

selecting at least one replacement character string from said candidate character strings based on said savings values;

preparing a Huffman table comprising Huffman codes for each of said plurality of characters and each of said at least one replacement character strings; and compressing said electronic programming guide using said Huffman table.

2. The method of claim 1, wherein said threshold number for each of said candidate character strings equals a median frequency of said plurality of characters, divided by the number of characters in said candidate character string.

3. The method of claim 1, wherein at least 10 but no more than 50 replacement character strings are selected.

4. The method of claim 1, wherein each of said savings values is equal to the number of times said candidate character string occurs in said data multiplied by the difference between said number of bits required to represent in Huffman code each of said characters comprising said candidate character string and an estimated number of bits comprising a Huffman code for said candidate character string.

5. The method of claim 1, wherein said data comprises said electronic programming guide.

6. A set-top box for receiving and decompressing a signal comprising an electronic programming guide in compressed form, said electronic programming guide comprising a plurality of characters, said set-top box comprising:

means for receiving said signal and providing data comprising a digital representation of said electronic programming guide in compressed form;

a first storage space for storing a Huffman tree, said Huffman tree including at least one terminal branch representing a character string, said character string comprising at least two characters;

a second storage space for storing application software for use with said Huffman tree to perform a decompression operation;

a third storage space for storing said data; and a microcontroller connected to said receiver means and to said first, second, and third storage spaces for causing said application software to perform said decompression operation on said data to obtain said electronic programming guide in decompressed form.

7. The set-top box of claim 6, wherein said receiver means comprises a receiver, a demodulator, and a buffer.

8. The set-top box of claim 6, wherein said first, second, and third storage spaces and said microcontroller comprise an integrated circuit chip.

9. The set-top box of claim 6, wherein said first and second storage spaces comprise a non-volatile memory and said third storage space comprises a volatile memory.

10. The set-top box of claim 9, wherein said first storage space is a ROM, said second storage space is an EEPROM, and said third storage space is a RAM.

11. The set-top box of claim 9, wherein said first and second storage spaces comprise a battery backed-up static RAM.

12. The set-top box of claim 9, wherein said first and second storage spaces comprise a flash memory.

13. The set-top box of claim 6, wherein said data is provided serially and said microcontroller further comprises an input pin on which to receive said serial data.

14. The set-top box of claim 6, wherein said data is provided in parallel and said microcontroller further comprises a plurality of input pins on which to receive said parallel data.

15. The set-top box of claim 6 further comprising an analog tuner.

16. The set top box of claim 6 further comprising a digital demultiplexer.

* * * * *

UNITED STATES PATENT AND TRADEMARK OFFICE
CERTIFICATE OF CORRECTION

PATENT NO. : 5,548,338
DATED : Aug. 20, 1996
INVENTOR(S) : Ellis et al.

It is certified that error appears in the above-indentified patent and that said Letters Patent is hereby corrected as shown below:

Title page item [73],
That portion of the Assignee section reading "News American Publishing, Inc." should read --News America Publications, Inc.--.

Signed and Sealed this

Nineteenth Day of August, 1997

Attest:

BRUCE LEHMAN

*Attesting Officer*     Commissioner of Patents and Trademarks